US012803281B2

(12) United States Patent
Hernandez Manchola et al.

(10) Patent No.: US 12,803,281 B2
(45) Date of Patent: Nov. 17, 2026

(54) FAULT HANDLING IN A TERMINAL OF A MULTI-TERMINAL HIGH-VOLTAGE DIRECT CURRENT TRANSMISSION SYSTEM

(71) Applicant: Siemens Energy Global GmbH & Co. KG, Munich (DE)

(72) Inventors: Alvaro Jose Hernandez Manchola, Erlangen (DE); Udo Rathje, Baiersdorf (DE); Thomas Haupt, Bamberg (DE); Matthias Foehr, Dormitz (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 116 days.

(21) Appl. No.: 18/992,424

(22) PCT Filed: Jul. 14, 2022

(86) PCT No.: PCT/EP2022/069724

§ 371 (c)(1),
(2) Date: Jan. 8, 2025

(87) PCT Pub. No.: WO2024/012680

PCT Pub. Date: Jan. 18, 2024

(65) Prior Publication Data

US 2026/0018886 A1 Jan. 15, 2026

(51) Int. Cl.
*H02J 3/00* (2026.01)
*G01R 31/08* (2020.01)
(Continued)

(52) U.S. Cl.
CPC .......... *H02J 3/0012* (2020.01); *G01R 31/086* (2013.01); *H02J 3/36* (2013.01); *H02M 1/344* (2021.05)

(58) Field of Classification Search
CPC .......... H02J 3/0012; H02J 3/36; H02M 1/344; G01R 31/086
See application file for complete search history.

(56) References Cited

U.S. PATENT DOCUMENTS 10,186,874 B2 * 1/2019 Choi ...................... G05B 15/02
2009/0278351 A1 * 11/2009 Rivas .................... F03D 7/0224 290/44

(Continued)

OTHER PUBLICATIONS

Joukhah, Zahra Solh: "Operation of HVDC converters for transformer inrush current reduction", Oct. 27, 2017 (Oct. 27, 2017), XP055588863; 2017.

(Continued)

*Primary Examiner* — Rafael O Leon De Domenech
(74) *Attorney, Agent, or Firm* — Laurence A. Greenberg; Werner H. Stemer; Ralph E. Locher

(57) ABSTRACT

A method for handling faults in a terminal of a multi-terminal high-voltage direct current transmission system. A DC voltage arising at a DC voltage connection of the terminal is continuously measured so as to form a DC voltage measurement value and information about the DC voltage measurement value is temporarily stored for a predetermined period of time. If a fault arises in an AC grid, a DC voltage measurement value which was measured before the fault arose is used as a setpoint value for a DC voltage controller and the DC voltage controller is used to regulate the DC voltage arising at the DC voltage connection to the setpoint value.

18 Claims, 5 Drawing Sheets

(51) Int. Cl.
*H02J 3/0012* (2026.01)
*H02J 3/36* (2006.01)
*H02M 1/34* (2007.01)

(56) References Cited

U.S. PATENT DOCUMENTS

| | | | | |
|---|---|---|---|---|
| 2019/0020193 | A1* | 1/2019 | Cao | H01H 33/596 |
| 2022/0206055 | A1* | 6/2022 | Verrax | G01R 31/086 |

OTHER PUBLICATIONS

Xu, Bin et al: "A Novel DC Chopper Topology for VSC-Based Offshore Wind Farm Connection", IEEE Transactions on Power Electronics, Institute of Electrical and Electro\ CS E\G \EERS, USA, Bd. 36, Nr. 3, Aug. 12, 2020 (Aug. 12, 2020), Seiten 3017-3027, XP011817167, ISSN: 0885-8993, DOI: 10.1109/TPEL.2020.3015979; 2020.

Stamatiou Georgios et al: "Decentralized converter controller for multiterminal HVDC grids", 2013 15th European Conference on Power Electronics and Applications (EPE), IEEE, Sep. 2, 2013 (Sep. 2, 2013), Seiten 1-10, XP032505618, DOI: 10.1109/EPE.2013.6634680; 2013.

* cited by examiner

FAULT HANDLING IN A TERMINAL OF A MULTI-TERMINAL HIGH-VOLTAGE DIRECT CURRENT TRANSMISSION SYSTEM

FIELD AND BACKGROUND OF THE INVENTION

The invention relates to a method for fault handling in a terminal of a multi-terminal high-voltage direct current transmission system, and to such a terminal.

Multi-terminal high-voltage direct current transmission systems will be employed in future for energy transmission. Two or more alternating current power grids can be connected, for example, to a multi-terminal high-voltage direct current transmission system of this type. Each of the alternating current power grids, in particular, is an energy transmission system. The two or more alternating current power grids are thus interconnected via the multi-terminal high-voltage direct current transmission system. In the event of a fault in one of the alternating current power grids, this can also result in the occurrence of a fault in another of the alternating current power grids, for example in the form of voltage fluctuations, current intensity fluctuations and/or power fluctuations. These impacts upon the other alternating current power grid, in which no fault is present, are undesirable.

SUMMARY OF THE INVENTION

The fundamental object of the present invention is the disclosure of a method and a terminal by means of which, in the event of the occurrence of a fault in an alternating current power grid which is connected to a multi-terminal high-voltage direct current transmission system, the impacts of this fault upon another alternating current power grid can be restricted.

According to the invention, this object is fulfilled by a method and by a terminal according to the independent patent claims. Advantageous configurations of the method and of the terminal are disclosed in the dependent patent claims.

A method is disclosed for fault handling in a terminal of a terminal high-voltage direct current transmission system, wherein:

the terminal comprises an AC voltage terminal and a DC voltage terminal;

the AC voltage terminal is connected to an AC power grid and the DC voltage terminal is connected to a DC power grid of the multi-terminal high-voltage direct current transmission system;

the terminal comprises a power converter, which is configured for converting the direct current of the DC power grid into the alternating current of the AC power grid and/or vice versa; and the terminal comprises an energy converter for converting electrical energy into thermal energy (by means of at least one electrical resistance element), wherein, according to the method:

the DC voltage on the DC voltage terminal of the terminal is progressively measured for the formation of a DC voltage measurement value, and information on this DC voltage measurement value is respectively buffered for a predetermined time interval; and in the event of the occurrence of a fault in the AC power grid, a DC voltage measurement value measured prior to the occurrence of the fault is employed as a target value for a DC voltage controller and, by means of the DC voltage controller, the DC voltage which is present on the DC voltage terminal is regulated to this target value.

In other words, further to the occurrence of the fault, the DC voltage which is present on the DC voltage terminal is regulated to that DC voltage which was in force prior to the occurrence of the fault. Impacts of the fault upon the DC voltage grid of the multi-terminal high-voltage direct current transmission system are reduced accordingly. Thus, the impacts of the fault upon another AC power grid which is connected to the multi-terminal high-voltage direct current transmission system such as, for example, an AC power grid which is connected to another terminal, are also reduced. In order to achieve this, information on progressively measured DC voltage measurement values is respectively buffered for a predetermined time interval. In particular, the respectively measured DC voltage measurement value can also be buffered for a predetermined time interval. Thus, even after the occurrence of the fault, a fault-free DC voltage value or DC voltage measurement value is available, in order to permit the regulation of the DC voltage to this value.

Thus, by means of the buffered information, in the event of a fault, the DC voltage is regulated to the value which was in force prior to the occurrence of the fault. In particular, from the buffered information, the measured DC voltage measurement value prior to the occurrence of the fault can be reconstructed and employed as a target value. However, the DC voltage measurement value can also be buffered, such that the latter is then available directly, and can be employed as a target value.

The method can be executed such that:

the DC voltage which is present on the DC voltage terminal is regulated to the target value, wherein the energy converter is actuated such that the energy converter converts electrical energy which is transmitted from the DC power grid to the terminal (the take-up of which by the AC power grid cannot be executed, on the grounds of the fault) into heat in a controlled manner, in the event that such electrical energy is transmitted to the terminal.

As a result, the DC voltage in the DC power grid drops. The energy converter is thus advantageously employed for influencing the DC voltage, in particular for regulating the DC voltage. In particular, electrical energy, the take-up of which by the AC power grid cannot be executed, on the grounds of the fault, is converted into heat. Such electrical energy is described hereinafter as "surplus electrical energy". Such surplus electrical energy, were it not converted into heat, would result in an (unwanted) rise in the DC voltage.

The method can be executed such that:

the DC voltage which is present on the DC voltage terminal is only regulated to the target value, by means of the DC voltage controller, in the event that the AC power grid in which the fault occurs is an AC power grid into which electrical energy is injected, or from which electrical energy is extracted, via the AC voltage terminal. In other words, the DC voltage which is present on the DC voltage terminal is only regulated to the target value, by means of the DC voltage controller, in the event that the AC power grid in which the fault occurs is electrically connected to the terminal for the purposes of an injection of energy into the AC power grid, or for the purposes of an extraction of energy from the AC power grid.

The method can also be executed such that:

the magnitude of the AC voltage on the AC voltage terminal is monitored, and the occurrence of a fault in the AC power grid is detected, in the event that the magnitude of the AC voltage undershoots a predetermined threshold value. Advantageously, the occurrence of the fault in the AC power grid can thus be identified in a simple manner.

The method can be executed such that:

the predetermined time interval lies between 0.5 s and 10 s, in particular between 1 s and 5 s. It is thus achieved that, in the event of the occurrence of a fault, information is available with respect to at least one DC voltage measurement value which was in force prior to the occurrence of the fault. The predetermined time interval can be, for example, 0.5 s, 1 s, 2 s, 5 s or 10 s.

The method can be executed such that:

information with respect to the DC voltage measurement value (or with respect to multiple DC voltage measurement values) is respectively buffered for a predetermined time interval by means of a time-delay element, in particular by a time-delay element of the first order. A first-order time-delay element of this type is also described as a PTI element.

The method can also be executed such that:

the energy converter comprises multiple energy converter modules, wherein each of the energy converter modules comprises an electronic switch and an electrical resistance element. As a result, the quantity of electrical energy which is converted into heat is adjustable (scalable) in a simple manner; the conversion of electrical energy into thermal energy is adjustable/scalable accordingly.

The method can be executed such that:

the AC power grid is an onshore AC power grid. The method is particularly advantageously applicable for the transmission of energy from a windfarm which, for example, is located offshore, to an AC power grid which is situated onshore (an onshore AC power grid).

According to the method, a unit can advantageously be connected to the multi-terminal high-voltage direct current transmission system for injecting renewable energy. A unit of this type can be, for example, a wind farm or a solar farm. The quantity of renewable energy generated is thus dependent upon influencing factors which cannot be controlled, or can only be controlled with difficulty, such as, for example, wind strength or incident solar radiation. Accordingly, the quantity of renewable energy generated cannot be simply reduced in a short-term manner. The method is therefore particularly advantageous for the transmission of renewable energy.

A terminal of a multi-terminal high-voltage direct current transmission system is moreover disclosed, wherein:

the terminal comprises an AC voltage terminal and a DC voltage terminal;

the AC voltage terminal is connected to an AC power grid, and the DC voltage terminal is connected to a DC power grid of the multi-terminal high-voltage direct current transmission system;

the terminal comprises a power converter, which is configured for converting the DC current of the DC power grid into the AC current of the AC power grid and/or vice versa;

the terminal comprises an energy converter for converting electrical energy into thermal energy (by means of at least one electrical resistance element);

the terminal comprises a measuring device for the progressive measurement of a DC voltage which is present on the DC voltage terminal of the terminal, by the formation of DC voltage measurement value, and a memory device for the buffering of information with respect to this DC voltage measurement value for a predetermined time interval; and the terminal comprises a DC voltage controller which is configured, in the event of the occurrence of a fault in the AC power grid, to employ a DC voltage measurement value which was measured prior to the occurrence of the fault as a target value, and to regulate the DC voltage which is present on the DC voltage terminal to this target value.

Thus:

the DC voltage controller is configured to regulate the DC voltage which is present on the DC voltage terminal to the target value, wherein the DC voltage controller actuates the energy converter such that the energy converter converts electrical energy which is transmitted from the DC power grid to the terminal (the take-up of which by the AC power grid cannot be executed, on the grounds of the fault) into heat, in the event that such electrical energy is transmitted to the terminal.

Thus:

the DC voltage controller can also be configured such that the DC voltage which is present on the DC voltage terminal is only regulated to the target value, by means of the DC voltage controller, in the event that the AC power grid in which the fault occurs is an AC power grid into which electrical energy is injected, or from which electrical energy is extracted, via the AC voltage terminal.

The terminal:

can comprise a monitoring device, which is configured to monitor the magnitude of the AC voltage on the AC voltage terminal and to detect an undershoot by the magnitude of the AC voltage of a predetermined value. It can thus be detected that a fault is present in the AC power grid.

The terminal can be configured such that:

the memory device comprises a time-delay element, in particular a time-delay element of the first order.

The terminal can also be configured such that:

the energy converter comprises multiple energy converter modules, wherein each of the energy converter modules comprises an electronic switch and an electrical resistance element.

A terminal of this type can also be described as a high-voltage direct current transmission station.

An exemplary application is the transmission of (in particular renewable) energy which is generated offshore (for example by means of a windfarm) to at least two onshore AC power grids by means of a multi-terminal high-voltage direct current transmission system.

The DC voltage controller, in particular, can be embodied in a controller of the energy converter.

The method and the terminal assume identical or equivalent advantages.

The invention is described in greater detail hereinafter with reference to exemplary embodiments. Identical reference symbols describe identical, or identically functioning elements.

DETAILED DESCRIPTION OF THE INVENTION

Figure 1:
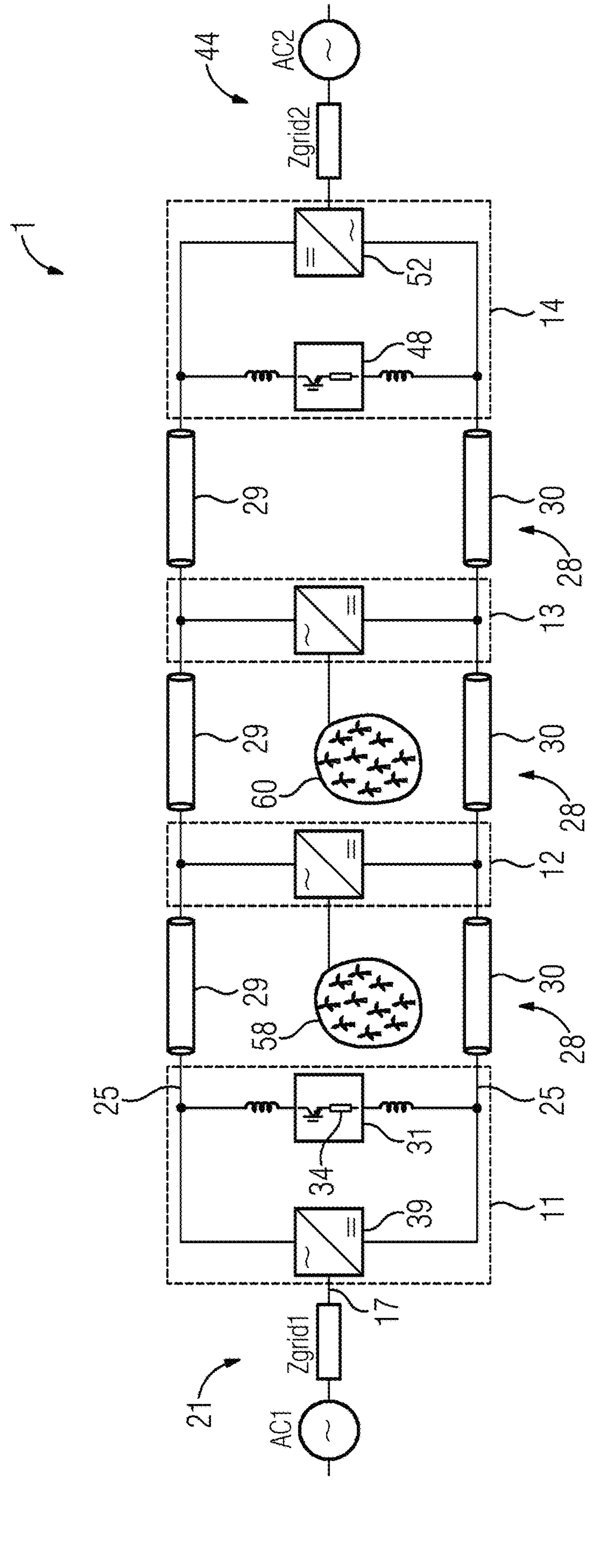
FIG. 1 shows an exemplary embodiment of a multi-terminal high-voltage direct current transmission system having four terminals.

FIG. 1 shows an exemplary embodiment of a multi-terminal high-voltage direct current transmission system 1 having four terminals. This multi-terminal high-voltage current transmission system 1 comprises a first terminal 11, a second terminal 12, a third terminal 13 and a fourth terminal 14. A first AC power grid 21 is connected to an AC voltage terminal 17 of the first terminal 11. For exemplary purposes, a first AC power source AC1 and a first network impedance Zgrid1 of the first AC power grid 21 are represented. A DC power grid 28 is connected to a DC voltage terminal 25 of the first terminal 11. The DC power grid 28 interconnects the DC voltage terminals of all four terminals. The DC power grid 28 comprises a first DC conductor 29 and a second DC conductor 30. In the exemplary embodiment, the first DC conductor 29 is a positive DC conductor and, in the exemplary embodiment, the second DC conductor 30 is a negative DC conductor.

The first terminal 11 moreover comprises an energy converter 31. The energy converter 31 comprises a resistance element 34. The energy converter 31 is connected in parallel with the DC voltage terminal 25. The energy converter 31 is thus connected between the first DC conductor 29 and the second DC conductor 30.

The first terminal 11 comprises a power converter 39. The power converter 39 connects the AC voltage terminal 17 to the DC voltage terminal 25. The power converter 39 is configured to convert the AC current which is present on the AC voltage terminal 17 into the DC current which is present on the DC voltage terminal 25 and/or vice versa. In particular, the power converter 39 can be a modular multilevel power converter (MMC).

The fourth terminal 14 is structured in an equivalent manner to the first terminal 11. An AC voltage terminal of the fourth terminal 14 is electrically connected to a second AC power grid 44. For exemplary purposes, a second AC power source AC2 and a second network impedance Zgrid2 of the second AC power grid 44 are represented. The DC power grid 28 is connected to a DC voltage terminal of the second terminal 14. The fourth terminal 14 comprises a further energy converter 48 and a further power converter 52.

The second terminal 12 and the third terminal 13 are moreover connected to the DC power grid 28. The second terminal 12 comprises a power converter, but no energy converter. The third terminal 13 also comprises a power converter, but no energy converter. A first windfarm 58 is connected to an AC voltage terminal of the second terminal 12; a second windfarm 60 is connected to an AC voltage terminal of the third terminal 13. The second terminal 12 is thus electrically connected to the first (offshore) windfarm 58; the third terminal 13 is electrically connected to the second (offshore) windfarm 60.

In the exemplary embodiment, the first AC power grid 21 and the second AC power grid 44 respectively are onshore AC power grids, i.e. the first AC power grid 21 and the second AC power grid 44 are arranged onshore (and not onshore). In the exemplary embodiment, the first AC power grid 21 and the second AC power grid 44 are operated by different network operators. In the event of the occurrence of a fault in the first AC power grid 21 (e.g. a short-circuit between two AC voltage lines), significant transient events can also occur in the second AC power grid 44, for example fluctuations in active power and in reactive power during and shortly after the occurrence of the fault. These fluctuations in the "sound" (i.e. fault-free) second AC power grid 44 are adversely viewed by the network operator of this second AC power grid 44, and are to be restricted to the greatest possible extent.

The energy converter 31 is arranged on the DC side of the power converter 39. As per the exemplary embodiment, it can be connected between the two poles 29, 30; however, it can also be connected between one of the poles and a neutral conductor, or between one of the poles and a ground potential. The energy converter 31 is employed for the take-up of a surplus of electrical energy generated ("surplus electrical energy") and the conversion thereof into thermal energy. In particular, surplus electrical energy of this type is that electrical energy which, on the grounds of the fault, cannot be transmitted to the AC power grid in the short term. For example, the energy converter 31 can be configured for the take-up and conversion of surplus electrical energy for a duration of a few seconds.

In particular, the first terminal 11 and the fourth terminal 14 can be respectively operated by two different control processes. However, both terminals are not simultaneously permitted to employ the same control process. The first control process regulates the DC voltage Vd of the DC power grid. The converter energy is regulated accordingly.

A terminal which is operated by the first control method outputs the electrical energy which is required by the remainder of the multi-terminal high-voltage direct current transmission system, or executes the take-up of electrical energy which is supplied by the remainder of the multi-terminal high-voltage direct current transmission system.

The second control method regulates active power which is transmitted to the connected AC power grid. If the converter energy departs from the permissible range, an energy controller is active, which adjusts the reference value for active current, such that the converter energy is restored to the permissible range.

Figure 2:
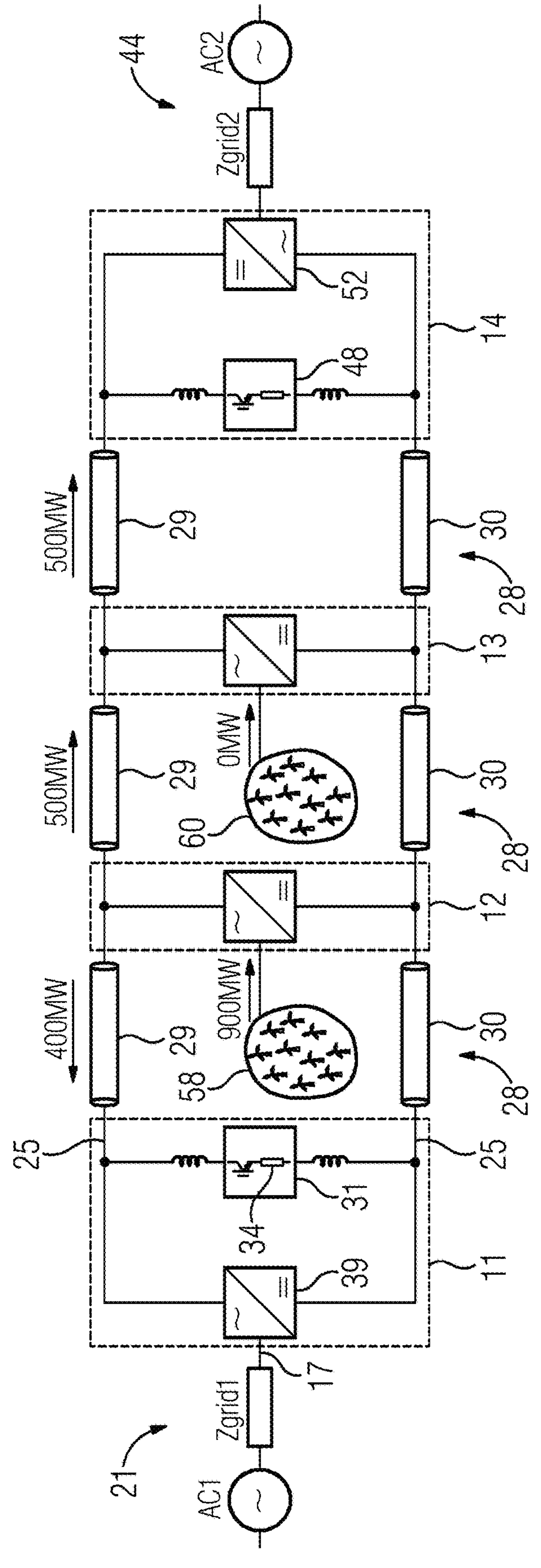
FIG. 2 shows the multi-terminal high-voltage direct current transmission system, with exemplary energy flows plotted.

FIG. 2 shows an exemplary operating state of the multi-terminal high-voltage direct current transmission system 1. The first windfarm 58 generates an electric power to the amount of 900 MW; the second windfarm 60 generates no electric power (0 MW). Electric power generated by the first windfarm 58 is divided into a first component having a magnitude of 400 MW, and a second component having a magnitude of 500 MW. The first component (400 MW) is transmitted from the second terminal 12 to the first terminal 11, and from the first terminal 11 to the first AC power grid 21. The first AC power grid 21 further transmits this first component to unrepresented loads.

The second component (500 MW) is transmitted from the second terminal 12 to the fourth terminal 14, and from the fourth terminal 14 to the second AC power grid 44. The second AC power grid 44 further transmits this second component to unrepresented loads.

Figure 3:
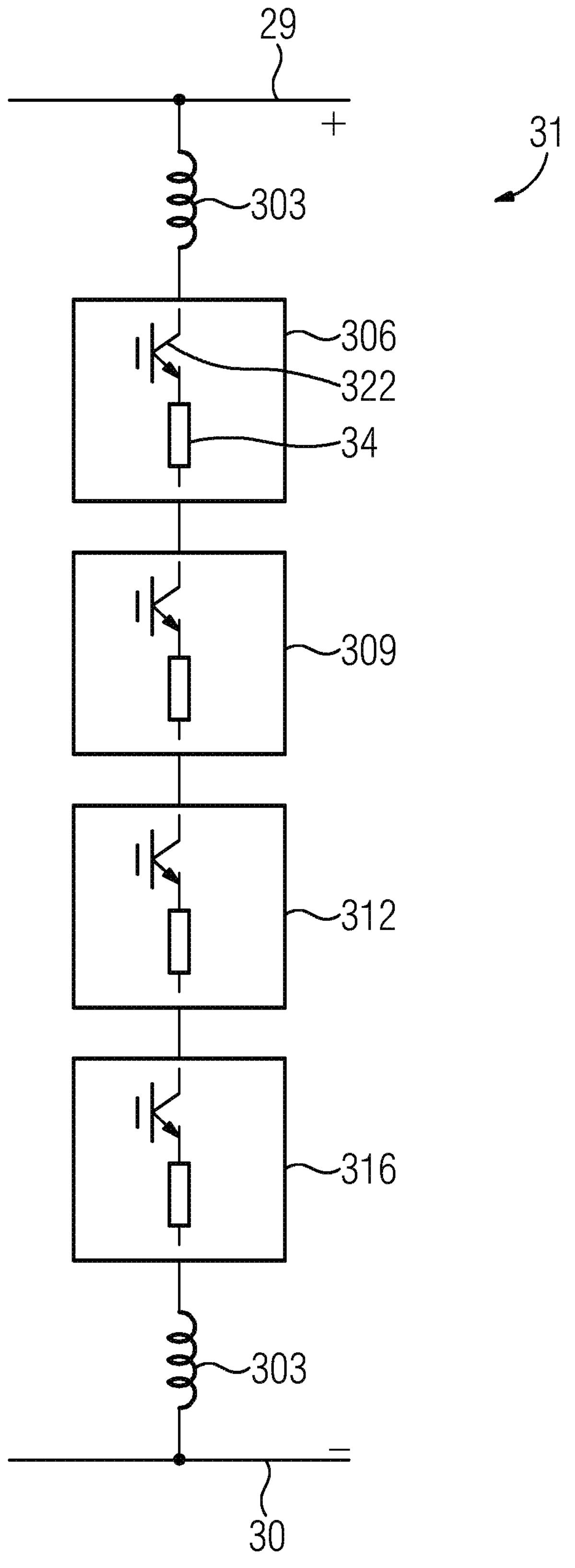
FIG. 3 shows an exemplary embodiment of an energy converter having multiple energy converter modules.

FIG. 3 represents the energy converter 31 in a detailed exemplary embodiment. The energy converter 31 is connected between the first positive DC conductor 29 and the second negative DC conductor 30. The energy converter 31 comprises two inductances in the form of choke coils 303, a first energy converter module 306, a second energy converter module 309, a third energy converter module 312 and a fourth energy converter module 316. Each of the energy converter modules 306, 309, 312 and 316 comprises an electronic switch 322 and the resistance element 34. In each of the energy converter modules, electronic switches can be switched in a mutually independent manner, such that an electric current flows in the respective resistance element and electrical energy in this resistance element is converted into thermal energy. The energy converter module is switched-on or active accordingly. Depending upon the number of switched-on/active energy modules, a different quantity of energy is thus converted into thermal energy. The magnitude of energy conversion is adjustable/scalable as a result. The second energy converter 48 is structured in an equivalent manner.

Figure 4:
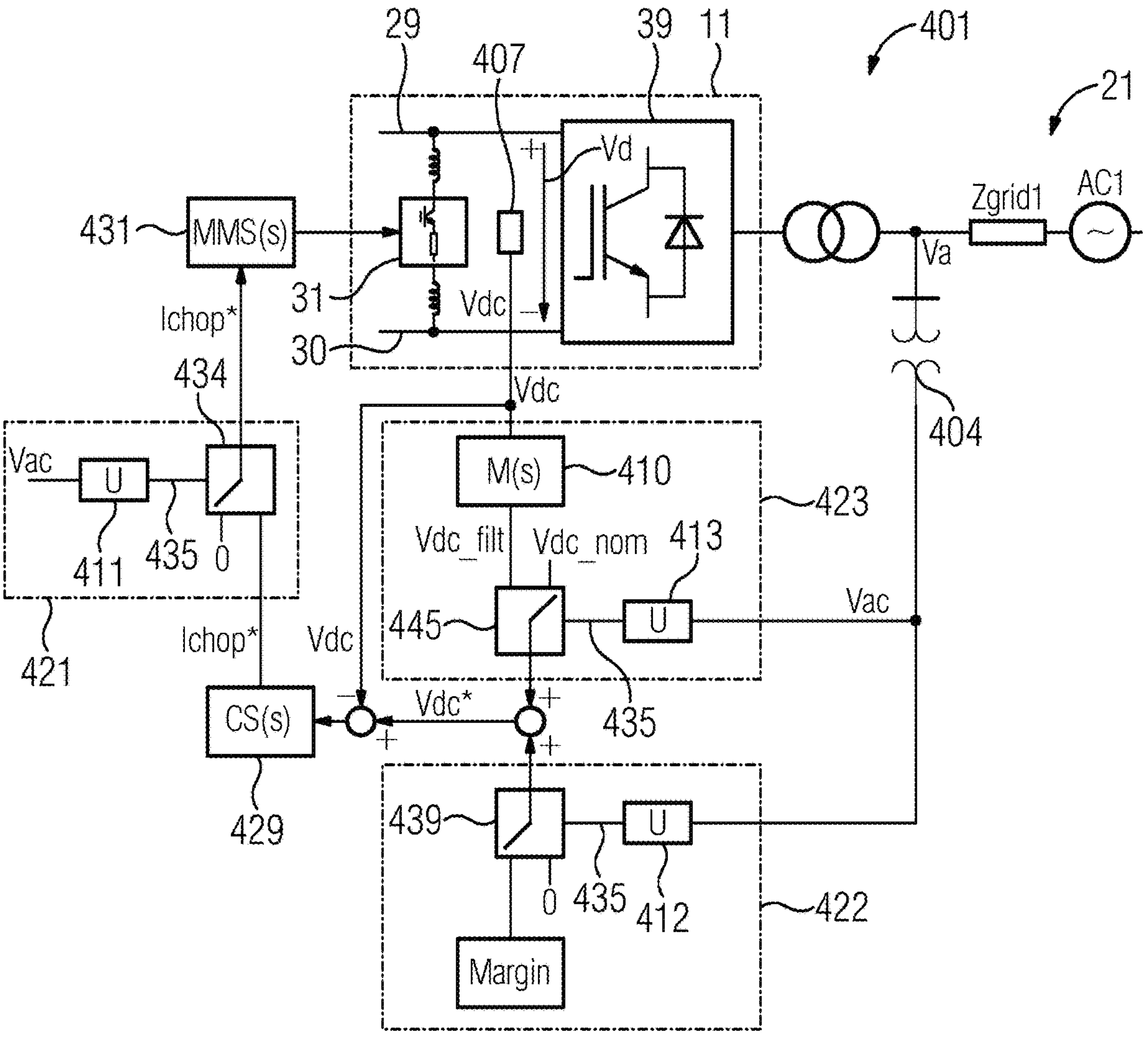
FIG. 4 shows an exemplary control loop for controlling the DC voltage which is present on the first terminal.

FIG. 4 shows an exemplary embodiment of a control loop 401 for controlling the DC voltage Vd. The DC voltage Vd is the DC voltage of the DC power grid 28 of the multi-terminal high-voltage direct current transmission system 1. In the upper part of FIG. 4, the first terminal 11, having the power converter 39 and the energy converter 31, is represented. It is intended that the energy converter 31 should be activated, in the event of the occurrence of an unwanted high DC voltage Vd in the DC power grid.

The first AC power grid 21 is connected to the first terminal 11. By means of an instrument transformer 404, the AC voltage Va of the first AC power grid 21 is measured by the formation of AC voltage measurement values Vac. AC voltage measurement values Vac are then transmitted to three different sections of the control loop 401. More specifically, AC voltage measurement values Vac are transmitted to a first monitoring device 411, a second monitoring device 412 and a third monitoring device 413. The first monitoring device 411, the second monitoring device 412 and the third monitoring device 413 are structured in an equivalent manner, and monitor the AC voltage for the presence of an undervoltage. The monitoring devices thus execute an undervoltage detection. The presence of an undervoltage is detected, in the event that the magnitude of the AC voltage undershoots a predetermined value. Thus, if the AC voltage measurement value Vac undershoots the predetermined value, it is detected that a fault has occurred in the AC power grid 21. A fault of this type (for example, a short-circuit) generally results in a reduction of the AC voltage Va on the AC power grid 21. The first monitoring device 411 is arranged in a first section 421 of the control loop; the second monitoring device 412 is arranged in a second section 422 of the control loop, and the third monitoring device 413 is arranged in a third section 423 of the control loop.

In the event that no fault occurs in the AC power grid 21, the control loop/control loop functions as follows: by means of a measuring device 407, the DC voltage Vd on the DC power grid 28 (which is applied between the first DC conductor 29 and the second DC conductor 30) is measured by the formation of a DC voltage measurement value Vdc. The DC voltage measurement value Vdc is compared with a DC voltage reference value Vdc*, and a deviation (difference) between the DC voltage reference value Vdc* and the DC voltage measurement value Vdc is formed. This deviation (Vdc*−Vdc) is fed to a DC voltage controller 429. In the event that the deviation (difference) between the DC voltage reference value Vdc* and the DC voltage measurement value Vdc is greater than a permissible tolerance value (margin), the DC voltage controller 429 outputs an energy converter reference current Ichop*, which is fed to a modulator 431. The tolerance value (margin) can correspond, for example, to an adjustable percentage value of a nominal DC voltage Vdc_nom. The DC voltage reference value Vdc* represents a target value for the DC voltage Vd (DC voltage target value Vdc*).

Thereafter, the modulator 431 actuates the energy converter 31 such that a current which corresponds to the energy converter reference current Ichop* flows through the energy converter 31, and a corresponding quantity of electrical energy is converted into thermal energy. In the exemplary embodiment, the modulator 431 actuates the energy converter 31 such that the number of energy converter modules 306, 309, 312, 316 of the energy converter 31 which are switched on by means of the electronic switch 322 is such that a current which corresponds to the energy converter reference current Ichop* flows through the energy converter 31.

In the event of the occurrence of a fault in the AC power grid 21, the three monitoring devices 411, 412, 413 detect this fault by reference to the voltage drop of the AC voltage on the first AC power grid, and output a fault signal 435. The fault signal 435 is employed in the first section 421, in the second section 422, and in the third section 423.

By means of the first section 421, it is achieved that the energy converter reference current Ichop* which is output by the DC voltage controller 429 is only transmitted to the modulator 431 in the event that the fault signal 435 is present, i.e. if a fault has occurred in the AC power grid 21. This is achieved by means of a first signal selection device 434, which is actuated by means of the fault signal 435. If the fault signal 435 is active (fault signal=1), the signal selection device 434 relays the energy converter reference current Ichop* which is output by the DC voltage controller 429 to the modulator 431. If the fault signal 435 is inactive (fault signal=0), the energy converter reference current Ichop* is set to zero (Ichop*=0), whereafter the modulator actuates the energy converter 31 such that the energy converter executes no energy conversion (all energy converter modules are switched off by means of the electronic switch 322). It is thus ensured that the energy converter of a terminal (in this case, of the first terminal 11) is only activated and executes an energy conversion in the event that a fault occurs in the AC power grid 21 which is connected to this terminal. Thus, in the exemplary embodiment, the energy converter 31 is only activated and only executes an energy conversion in the event that a fault occurs in the first AC power grid 21 which is connected to the first terminal 11.

In the exemplary embodiment, the first component of electrical energy (400 MW) is transmitted from the second terminal 12 to the first terminal 11. On the grounds of the fault in the first AC power grid 21, however, the first component of electrical energy cannot be further transmitted to the first AC power grid 21. This first component would result in a rise in the DC voltage Vd in the DC power grid 28, thus additionally generating unwanted impacts in the second AC power grid 44. However, the first component of electrical energy (400 MW) is converted into heat by means of the energy converter 31, such that impacts upon the second AC power grid 44 are reduced.

By means of the second section 422, it is achieved that permissible tolerance value (margin) is only employed in the event that the fault signal 435 is inactive (fault signal=0), i.e. if no fault is present in the AC power grid 21. This is achieved by means of a second signal selection device 439, which is actuated by means of the fault signal 435. If the fault signal 435 is active (fault signal=1), the tolerance value (margin) is set to zero (margin=0). If the fault signal 435 is inactive (fault signal=0), the predetermined tolerance value (margin) is then employed.

In the third section 423, information with respect to the respectively measured DC voltage measurement value Vdc is buffered for a predetermined time interval in a storage device 410. If the fault signal 435 is inactive (fault signal=0), the nominal DC voltage value Vdc_nom is then relayed to the DC voltage controller 429 by means of a third signal selection device 445. However, in the event of the occurrence of a fault in the AC power grid 21, i.e. if the fault signal 435 is thus active (fault signal=1), the third signal selection device 445, in place of the nominal DC voltage value Vdc_nom, then relays the saved DC voltage measurement value Vdc_filt to the DC voltage controller 429. In consequence, in the event of a fault in the DC power grid 21, that DC voltage value Vd which was in force prior to the occurrence of the fault is also employed further to the occurrence of the fault as the nominal DC voltage value for the DC voltage controller 429. In the exemplary embodiment, the memory device 410 is configured as a time-delay element, in particular as a time-delay element of the first order. This time-delay element constitutes a measurement filter.

In the event of the occurrence of a fault in the AC power grid 21, the filtered DC voltage measurement value Vdc_filt (i.e. the buffered DC voltage measurement value Vdc_filt) is then employed as the nominal DC voltage value for the DC voltage controller 429. The time constant of the time-delay element (which corresponds to the predetermined time interval of buffering) can lie, for example, between 0.5 s and 10 s, preferably between 1 s and 5 s. One potential value would be, for example, 2 s. In other exemplary embodiments, however, the memory device 410 can be configured differently, for example in the form of a storage cell or in the form of a shift register.

Thus, according to the method, by means of a measuring device 407, the DC voltage Vd of the DC power grid 28 (which is present between the first DC conductor 29 and the second DC conductor 30) is measured by the formation of DC voltage measurement values Vdc. DC voltage measurement values Vdc are fed to the memory device 410. The memory device 410 saves information with respect to the DC voltage measurement values Vdc for a predetermined time interval. By means of the memory device 410, it is achieved that, in the event of the occurrence of a fault, information is available with respect to at least one DC voltage measurement value Vdc which was in force prior to the occurrence of the fault. In the event of a fault, i.e. further to the occurrence of the fault, a saved DC voltage measurement value Vdc_filt is then employed as the nominal DC voltage value for the DC voltage controller 429. As a result, the DC voltage controller 429 regulates the DC voltage Vd to the value which was in force prior to the occurrence of the fault. The DC voltage Vd is an electrical variable which associates the first AC power grid 21 with the second AC power grid 44—c.f. FIG. 1. As the DC voltage Vd, further to the occurrence of a fault, is restored by means of the DC voltage controller 429 to the value thereof which was in force prior to the occurrence of the fault, the impacts of the fault in the first AC power grid 21 upon the second AC power grid 44 are relatively minor. With respect to fault impacts, the second AC power grid 44 is dissociated from the first AC power grid 21.

The control method described in conjunction with FIG. 4, in particular, is independent of the above-mentioned first control method and of the second control method. In particular, the control method described in conjunction with FIG. 4 can be embodied in a controller for the energy converter.

Figure 5:
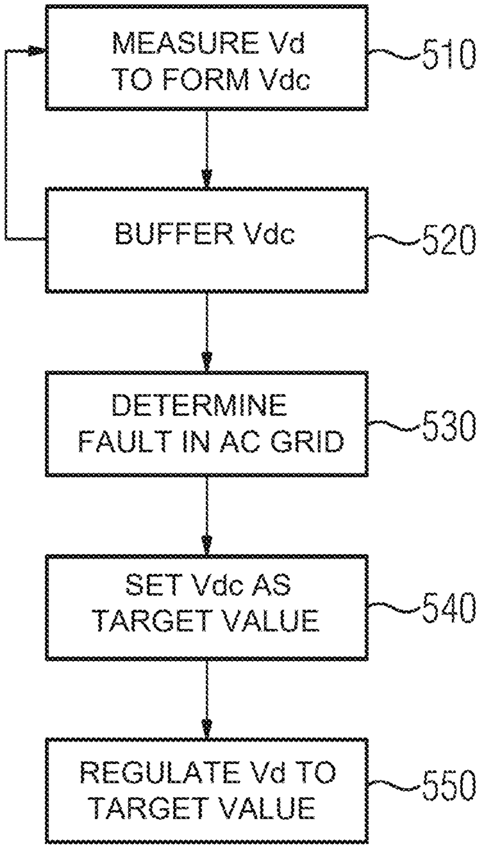
FIG. 5 shows an exemplary process sequence, by reference to a flow diagram.

FIG. 5 represents a further exemplary process sequence in the form of a flow diagram. Process steps 510 to 550 are executed as follows:

Process Step 510:

Progressive (repeated) measurement of the DC voltage Vd which is present on the DC voltage terminal 25 of the terminal 11, by the formation of a DC voltage measurement value Vdc;

Process Step 520:

Buffering of information with respect to the respective DC voltage measurement value Vdc for a predetermined time interval;

Process Step 530:

Detection of the occurrence of a fault in the AC power grid 21;

Process Step 540:

Employment of a DC voltage measurement value Vdc_filt which has been measured and buffered prior to the occurrence of the fault as a target value for a DC voltage controller 429;

Process Step 550:

Regulation of the DC voltage Vd which is present on the DC voltage terminal 25 to the target value (by means of the DC voltage controller 429).

The case has been described wherein a fault occurs in the first AC power grid 21 and the impacts of this fault are reduced by means of the first terminal 11 (i.e. by means of the terminal to which the defective first AC power grid 21 is connected). To this end, the energy converter 31 of this first terminal 11 and the controller for this energy converter 31 which, in particular, is also embodied in the first terminal 11, are employed. The further energy converter 48 of the fourth terminal 14 and the controller for this further energy converter 48 which, in particular, can also be arranged in the fourth terminal 14, are not employed for fault handling.

In the event that, in another exemplary embodiment, the fault occurs in the second AC power grid 44, the above-mentioned method is executed in an equivalent manner, using the further energy converter 48 of the fourth terminal 14 and using the controller for this further energy converter 48. With respect to the further energy converter 48 and the associated controller, the fourth terminal 14 is thus configured in an equivalent manner to the first terminal 11.

A method and a terminal of a multi-terminal high-voltage direct current transmission system have been described, by means of which, in the event of the occurrence of a fault in an AC power grid which is connected to the multi-terminal high-voltage direct current transmission system, impacts of the fault upon another connected AC power grid are restricted. This is executed by a buffering of information with respect to progressively measured DC voltage measurement values for the period following the potential occurrence of the fault. In the event of a fault, by means of the buffered information, the DC voltage is regulated to the value which was in force prior to the occurrence of the fault.

REFERENCE SYMBOLS

1 Multi-terminal high-voltage direct current transmission system
11 First terminal
12 Second terminal
13 Third terminal
14 Fourth terminal

17 AC voltage terminal
21 First AC power grid
25 DC voltage terminal
28 DC power grid
29 First DC conductor
30 Second DC conductor
31 Energy converter
34 Resistance element
39 Power converter
44 Second AC power grid
48 Further energy converter
52 Further power converter
58 First wind farm
60 Second wind farm
303 Choke coil
306 First energy converter module
309 Second energy converter module
312 Third energy converter module
316 Fourth energy converter module
322 Electronic switch
401 Control loop
404 Instrument transformer
411 First monitoring device
412 Second monitoring device
413 Third monitoring device
421 First section
422 Second section
423 Third section
429 DC voltage controller
431 Modulator
435 Fault signal
434 First signal selection device
439 Second signal selection device
445 Third signal selection device
AC1 First AC power source
AC2 Second AC power source
Va AC voltage
Vd DC voltage
Vac AC voltage measurement value
Vdc DC voltage measurement value
Zgrid1 First network impedance
Zgrid2 Second network impedance

The invention claimed is:

1. A method for fault handling in a terminal of a multi-terminal high-voltage direct current transmission system, wherein the terminal includes:

an AC voltage terminal connected to an AC power grid and a DC voltage terminal connected to a DC power grid of the multi-terminal high-voltage direct current transmission system;

a power converter configured for at least one of converting a direct current of the DC power grid into an alternating current of the AC power grid or converting the alternating current of the AC power grid into the direct current of the DC power grid; and an energy converter for converting electrical energy into thermal energy;

the method comprising:

progressively measuring the DC voltage on the DC voltage terminal of the terminal for forming a DC voltage measurement value, and buffering the information on the DC voltage measurement value for a predetermined time interval; and upon an occurrence of a fault in the AC power grid, employing a DC voltage measurement value measured prior to the occurrence of the fault as a target value for a DC voltage controller, and regulating the DC voltage on the DC voltage terminal to the target value by the DC voltage controller.

2. The method according to claim 1, wherein the step of regulating the DC voltage which is present on the DC voltage terminal to the target value comprises actuating the energy converter to convert electrical energy which is transmitted from the DC power grid to the terminal into heat, when such electrical energy is transmitted to the terminal.

3. The method according to claim 1, which comprises:

regulating the DC voltage present on the DC voltage terminal to the target value, by the DC voltage controller, only when the AC power grid in which the fault occurs is an AC power grid into which electrical energy is injected via the AC voltage terminal, or from which electrical energy is extracted via the AC voltage terminal.

4. The method according to claim 1, which comprises monitoring a magnitude of the AC voltage on the AC voltage terminal, and detecting the occurrence of the fault in the AC power grid when the magnitude of the AC voltage undershoots a predetermined threshold value.

5. The method according to claim 1, wherein the predetermined time interval lies between 0.5 s and 10 s.

6. The method according to claim 5, wherein the predetermined time interval lies between 1 s and 5 s.

7. The method according to claim 1, which comprises respectively buffering information with respect to the DC voltage measurement value for a predetermined time interval by a time-delay element.

8. The method according to claim 7, wherein the time-delay element is a time-delay element of the first order.

9. The method according to claim 1, wherein the energy converter comprises multiple energy converter modules, and wherein each of the energy converter modules comprises an electronic switch and an electrical resistance element.

10. The method according to claim 1, wherein the AC power grid is an onshore AC power grid.

11. The method according to claim 1, which comprises connecting a unit for injecting renewable energy to the multi-terminal high-voltage direct current transmission system.

12. A terminal of a multi-terminal high-voltage direct current transmission system, the terminal comprising:

an AC voltage terminal and a DC voltage terminal;

said AC voltage terminal being connected to an AC power grid, and said DC voltage terminal being connected to a DC power grid of the multi-terminal high-voltage direct current transmission system;

a power converter configured for at least one of converting a DC current of the DC power grid into an AC current of the AC power grid or converting the AC current of the AC power grid into the DC current of the DC power grid;

an energy converter for converting electrical energy into thermal energy;

a measuring device for progressively measuring a DC voltage present on said DC voltage terminal for forming a DC voltage measurement value, and a memory device for buffering information pertaining to the DC voltage measurement value for a predetermined time interval; and a DC voltage controller configured, in an event of an occurrence of a fault in the AC power grid, to employ a DC voltage measurement value which was measured prior to the occurrence of the fault as a target value, and to regulate the DC voltage present on said DC voltage terminal to the target value.

13. The terminal according to claim 12, wherein said DC voltage controller is configured to regulate the DC voltage present on said DC voltage terminal to the target value by actuating said energy converter to cause said energy converter to convert electrical energy that is transmitted from the DC power grid to the terminal into heat, when such electrical energy is transmitted to the terminal.

14. The terminal according to claim 12, wherein said DC voltage controller is configured to only regulate the DC voltage present on the DC voltage terminal to the target value when the AC power grid in which the fault occurs is an AC power grid into which electrical energy is injected via said AC voltage terminal, or from which electrical energy is extracted via said AC voltage terminal.

15. The terminal according to claim 12, which comprises a monitoring device configured to monitor a magnitude of the AC voltage on said AC voltage terminal and to detect an undershoot of a predetermined value by the magnitude of the AC voltage.

16. The terminal according to claim 12, wherein said memory device comprises a time-delay element.

17. The terminal according to claim 16, wherein said time-delay element is a time-delay element of the first order.

18. The terminal according to claim 12, wherein said energy converter comprises multiple energy converter modules, and wherein each of said energy converter modules comprises an electronic switch and an electrical resistance element.

* * * * *